United States Patent [19]
Bast et al.

[11] Patent Number: 4,876,179
[45] Date of Patent: Oct. 24, 1989

[54] METHOD FOR MANUFACTURING CERAMIC MATERIAL HAVING PIEZO-ELECTRIC PROPERTIES

[75] Inventors: Ulrich Bast, Munich; Wolfram Wersing, Kirchheim, both of Fed. Rep. of Germany

[73] Assignee: Siemens Aktiengesellschaft, Berlin and Munich, Fed. Rep. of Germany

[21] Appl. No.: 60,168

[22] Filed: Jun. 10, 1987

[30] Foreign Application Priority Data

Jun. 13, 1986 [DE] Fed. Rep. of Germany ....... 3619871

[51] Int. Cl.$^4$ .............................................. G03C 5/40
[52] U.S. Cl. .................................. 430/320; 430/198; 430/330

[58] Field of Search ............... 430/311, 320, 330, 198, 430/322, 394

[56] References Cited

U.S. PATENT DOCUMENTS 3,615,457 10/1971 Seibert et al. ..................... 430/198
4,555,285 11/1985 Chance et al. ..................... 156/89

Primary Examiner—Jose G. Dees
Attorney, Agent, or Firm—Hill, Van Santen, Steadman & Simpson

[57] ABSTRACT

A method for manufacturing piezo-electric ceramic materials having predetermined acoustic impedance, wherein internal cavities are generated by a photolithographic process, utilizing a foil stack of green ceramic foils.

14 Claims, 3 Drawing Sheets

METHOD FOR MANUFACTURING CERAMIC MATERIAL HAVING PIEZO-ELECTRIC PROPERTIES

BACKGROUND OF THE INVENTION

1. Field of the Invention

The present invention is in the field of manufacturing ceramic materials having controlled acoustic properties by providing a predetermined pattern of internal voids in the ceramic using a photolithographic process.

2. Description Of The Prior Art

It is known to employ piezo-electric ceramics for ultrasound transducers. The problem which exists is to couple the acoustic oscillatory energy of the transducer to the medium, for example, air or water, to efficiently transfer the energy for the propagation of the acoustic wave. Similar requirements occur for the operation of such a transducer as an ultrasound receiver.

The acoustic impedance of a material is dependent on the product of the speed of sound in the material and the density thereof. Both properties are characteristics of the material which can not controlled at least within broad limits. Although the density of a ceramic material can be controlled by introducing greater or lesser amounts of porosity into the structure, this can only be done at the expense of the stability of the material.

One solution which has been proposed is to provide a transducer composed of a piezo-electric ceramic which has an adaptation layer of material of lower density and a lower sound propagation velocity. Choosing an appropriate mean value for the ceramic material of the transducer and for the propagation medium can result in a very good adaptation, an optimum adaptation at one quarter wavelength, for this one wavelength alone.

Another solution which has been suggested is to fabricate the ceramic material of the ultrasound transducer in two phases to form a composite material. The one phase consists of the ceramic material matrix and the other is an additive which produces cavities in the ceramic material.

SUMMARY OF THE INVENTION

The present invention provides a method for producing a two for instance lead zirconattitanat phase, ceramic material having piezo-electric properties and a predetermined pattern of internal cavities for controlling the acoustic impedance. With the method of the present invention, the acoustic impedance of the two phase material can be reliably controllled over a wide range.

In accordance with the present invention, the ceramic material is first formed into thin green foils. The surface of each foil is then coated with a layer of a photo-sensitive material, whereupon the photo-sensitive material is exposed and developed to leave a pattern of exposed photo-sensitive material deposits thereon of a predetermined size and shape. A and sintered to produce a ceramic body having the desired predefined pattern of internal cavities contained therein.

The foils may be annealed before sintering in an atmosphere which may be different from the sintering atmosphere. For example, the foils may be annealed in an atmosphere created by heating the foils in a closed vessel to liberate organic materials. Alternatively, or additionally the annealing can be carried out under reduced pressure. This annealing may be performed at temperatures up to 200°.

The pressing of the foils into a stack is carried out at a temperature above room temperature, normally between 50° and 150° C.

The foils are preferably heated to the sintering temperature by first heating the same with rising temperatures, for instance 1 K/min, up to a temperature in the range of about 300° to 400° C. in a non-oxidizing and then heating up to the sintering temperature (up to 1250°) in an atmosphere of oxygen. Nitrogen is the preferred non-oxidizing atmosphere.

The present invention proceeds on the basis that the cavities formed in the ceramic phase should be introduced in ordered form in terms of size and/or distribution. By doing so, there is achieved a controllable attainment of prescribed values of acoustic impedance. Homogeneity of the material is also achieved. The pore size can be predetermined in accordance with the present invention. In fact, cavities of essentially the same size and of a prescribed size range can be manufactured. The shape of the prescribed cavities can also be selected in accordance with the invention, within very broad limits. For example, the pores can have cylindrical, cuboid, or cubic shape and the like and including rounded edges and corners.

With the present invention, these cavities can be controlled as to extent in defined position in the ceramic material, particularly in a regular arrangement relative to one another. Thus, there can be a lesser number of internal cavities closer to the surface of the ceramic body than at the center thereof. This is of particular interest when a body of such ceramic material is subsequently ground and cavities in the surface region would then lead to open cavities. This would be a disadvantage, particularly in the matter of electrical contacting.

One of the advantages of the invention is that the method described herein also provides the possibility of influencing the ratio of transverse coupling to longitudinal coupling and the mechanical properties of the material on the basis of an appropriate arrangement of cavities in a predetermined pattern. A regular arrangement of flat cavities in the ceramic material is especially suited for this purpose.

The method of the present invention permits a ceramic material having piezo-electric properties to be manufactured for ultrasound transducers whose impedance is highly adapted to the acoustical impedance of body tissue ($1.5 \times 10^6 kg/m^2s$), in order to achieve high penetration depth with good axial resolution.

The method of the present invention permits a ceramic material to be produced having a regular arrangement of identically structured or identically shaped cavities in a ceramic material which itself has a high density and low porosity.

The ceramic matrix material is manufactured first by way of usual mixing, grinding, and converting processes. The raw ceramic material is then processed to form green foils having the lowest possible thickness. Foil thicknesses down to 30 microns can be achieved, and the preferred range of thickness is 30 to 50 microns. The green foil is defined as that composition which is still unsintered but which has been processed into a thin shape retaining a certain amount of plasticity. Lead zirconate titanates, barium titanates and other known piezo-electric ceramic materials are suitable for the manufacture of such green foils which constitute the first phase of the ceramic material of the invention.

Instead of the elements lead, zirconium and/or titanium, other know substitution elements can be contained in greater or lesser proportions. Such piezo-electric materials are also usually doped, for example, with rare earths, or manganese, chromium, or the like. All of these materials of the ceramic phase have prescribed values of acoustic impedance which is essentially dependent only on the inherent porosity of the ceramic and the composition of the material.

In accordance with the present invention, the green foils are superficially provided with a layer of a photo-sensitive material on one surface thereof. The photo-sensitive material may be a photoresist layer, a dry film photoresist, or the like. The layer of photo-sensitive material is preferably produced in thicknesses of 5 to 20 microns and should be of approximately the same thickness as the green foil insofar as possible.

The photo-sensitive material in the form of a layer is exposed in the usual fashion of standard photolithographic procedures. It is important for the purposes of the present invention that after carrying out the photolithographic process, only those portions of the original photo-sensitive layer which correspond in form and distribution to the required cavities of the final ceramic material to be manufactured remain on the foil surface. For example, the remaining portions may have a cylindrical shape, a cuboid shape or a cubic shape which are retained from the developed photo-sensitive layer. Such shapes and the required regular distribution on the foil surface can be achieved by means of the photolithographic process. Positive photoresist materials can be used in conjunction with a mask (contact or projection) having holes therein corresponding in size and arrangement to the portions of the layer on the foil surface which remain in accordance with the present invention. Other exposure methods, however, can also be used such as computer controlled printing.

The dimensions of the cylindrical, cuboid or cubic shape of the remaining portions of the photolayer are in the range from 50 to 100 microns and particularly at about 80 microns. Depending on the shrinkage characteristics of the ceramic, a final dimension of 50 microns for a cavity in the sintered body is achieved from the latter dimension.

After exposure and development, the green foils provided with the residual portions of the photolayer are stacked on top of each other and pressed at temperatures ranging from about 50° to 150° C. Such method steps are fundamentally known from multilayer ceramic elements. It is essential for the purposes of this invention that the pressing be carried out to such a degree that the remaining portions of the photo-sensitive layer are pressed entirely into the green foils and otherwise lie superficially against one another. Rounding deformations of the edges and corners of the photolayer portions are achieved in the pressing, so that the finished cavities are rounded off to some degree. Finally, the pressed stack is sintered upon application of standard, high sintering temperatures.

The stack of foils can be annealed before sintering. However, the annealing can also be carried out in the initial phase of heating up to the sintering process.

The sintering can be carried out in a conventional manner. It is advantageous, however, to provide a slow heating for reaching the sintering temperature. In particular, it is advisable to provide a heating up with temperatures increasing in steps and including holding times.

BRIEF DESCRIPTION OF THE DRAWINGS

A further description of the present invention will be made in conjunction with the attached sheets of drawings in which.

DESCRIPTION OF THE PREFERRED EMBODIMENTS

Figure 1:
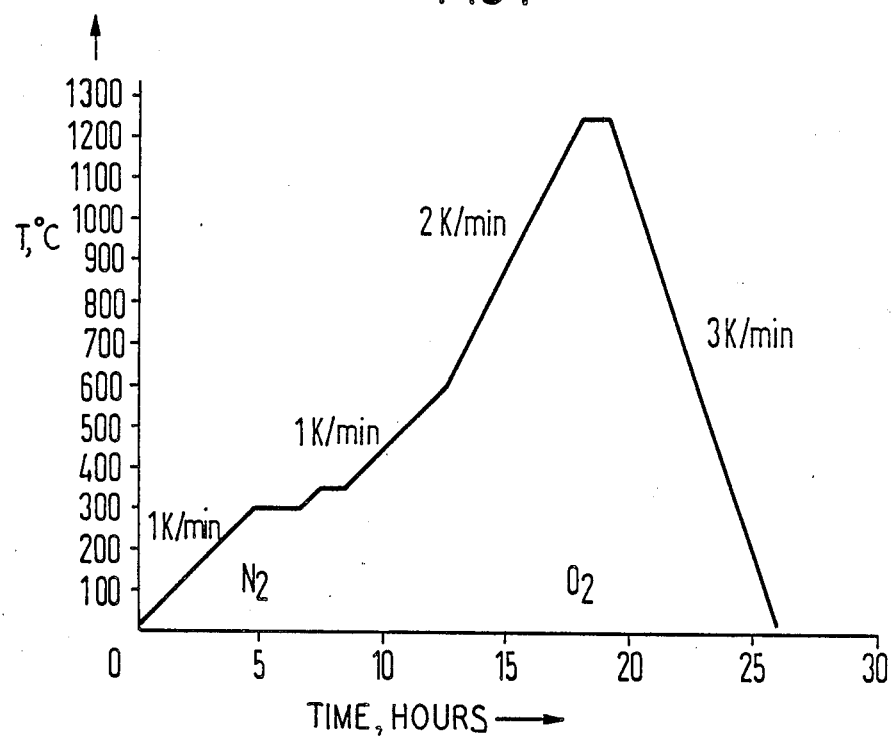
FIG. 1 shows a particularly suitable temperature schedule time (hours) versus preferred rise of temperature (1K/min; 2K/min) is shown for approaching and carrying out the sintering process.
Figure 2:
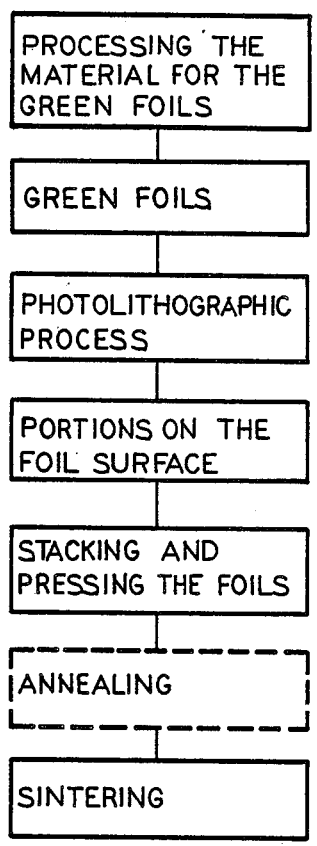
FIG. 2 is a flow chart relating to the method of the present invention.

There is a considerable advantage to be obtained by providing differing atmospheres during the sintering process and/or in approaching the sintering temperature, as shown in FIG. 1. As illustrated, the heating up can occur in a nitrogen atmosphere up until the time a temperature of about 300° to 400° C. is reached whereupon the atmosphere is changed to that of an oxygen gas. Starting with the non-oxidizing atmosphere is an advantage in that it prevents too rapid an oxidation of the organic compounds still present during the sintering process.

Figure 5:
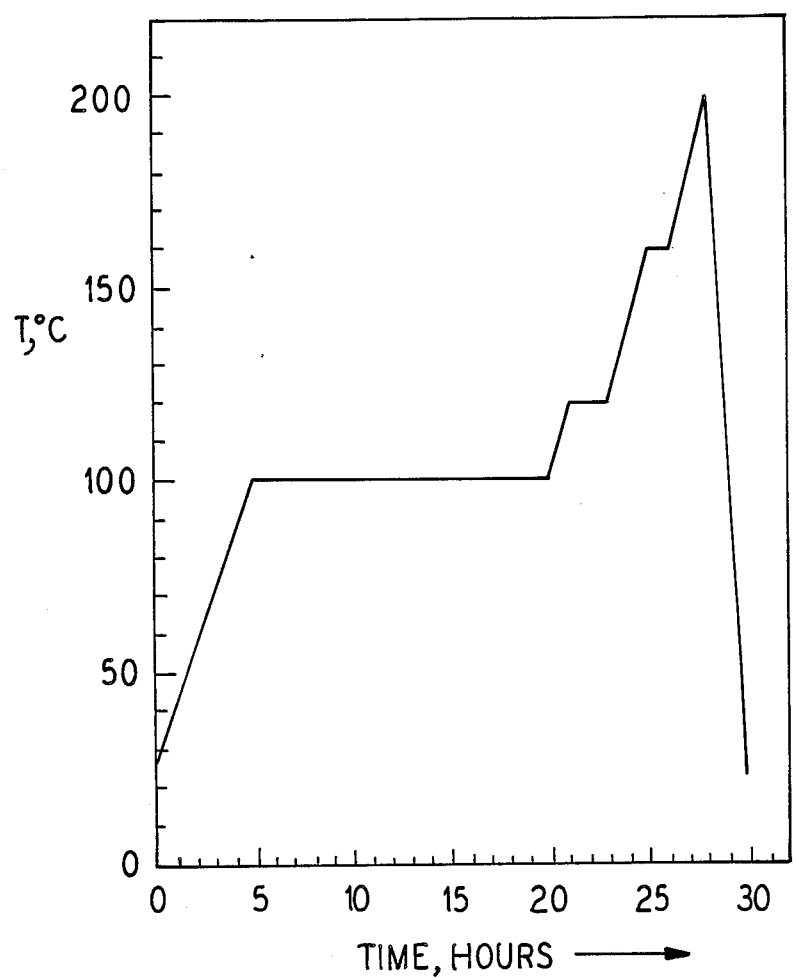
FIG. 5 shows a temperature schedule for annealing before sintering.

During the annealing phase either as a separate method step or at the beginning of the sintering process, it is recommended that the highly volatile organic components be expelled in a reducing and/or reduced pressure atmosphere. In particular, the annealing can be carried out in a self-created atmosphere, namely, one created by heating the material in a closed vessel to provide an atmosphere of volatilized gases. Good results are achieved by annealing according to FIG. 5.

In a preferred form of the present invention, the exposed and developed photo-sensitive layer is re-exposed with ultraviolet radiation, such as with a mercury vapor lamp, before the stacking and pressing. A hardening process is thus carried out wherein a portion of the highly volatile components of the photo-sensitive material is removed without the material becoming brittle.

Ceramic bodies manufactured in accordance with the present invention can be metallized with conventional vapor deposition or sputtering methods in order to manufacture the required electrodes. The electrical polarization required for the piezoelectric behavior is achieved by applying electrical voltage. In particular, this may be carried out in a sulfur hexafluoride atmosphere.

Figure 3:
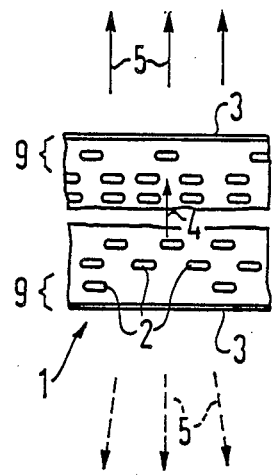
FIG. 3 illustrates a polished section of a transducer body composed of ceramic material produced according to the present invention.

Referring to FIG. 3, there is shown a polished section of a transducer body having a regular arrangement of layers and likewise regular cavities 2 corresponding to the original foils making up the ceramic body 1. The electrodes 3 can be applied by suitable metal deposition processes. The arrow 4 indicates the polarization that has already been impressed. The ceramic body 1 can be employed as an acoustic transducer and, when an alternating current voltage at its resonant frequency is applied, the transducer 1 is placed into a mechanical oscillatory condition and emits ultrasound radiation indicated by the arrows 5 into the environment consisting of the adjacent medium. On the basis of the dimensioning of the distribution, density, and size of the generated cavities 2, an acoustic impedance which is acoustically matched to the adjacent medium into which the ultrasound radiation 5 is propagated can be achieved for the body of the transducer.

Figure 4:
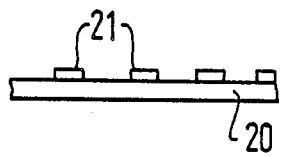
FIG. 4 is a side elevational view of the ceramic foil after the photolithographic step has been carried out.

FIG. 4 is a side view of the foil after carrying out the photolithographic step. The foil 20 is shown having spaced deposits 21 which remain after the developing process and which ultimately form the arrangement of internal cavities shown in FIG. 3.

It will be evident that various modifications can be made to the described embodiments without departing from the scope of the present invention.

We claim as our invention:

1. A method for the manufacture of ceramic material for ultrasound transducers having piezo-electric properties and a pre-defined arrangement of internal cavities which comprises:
   forming thin green foils of said ceramic material,
   coating a surface of each foil with a layer of a photo-sensitive material,
   exposing and developing said photo-sensitive material to leave a pattern of exposed photo-sensitive material thereon of a predetermined size and shape,
   stacking up a plurality of the foils, and
   pressing and sintering the stacked foils to produce a ceramic body having said pre-defined pattern of internal cavities contained therein and a predetermine porosity, said foils being heated to sintering temperature by first heating the same up to a temperature in the range of about 300° to 400° C. in a non-oxidizing atmosphere and then heating up to sintering temperature in an atmosphere of oxygen.

2. A method according to claim 1 wherein said non-oxidizing atmosphere is an atmosphere is an atmosphere of nitrogen.

3. A method according to claim 1 which includes the step of annealing said foils before said sintering.

4. A method according to claim 1 wherein said annealing is carried out in an atmosphere different from the sintering atmosphere.

5. A method according to claim 4 wherein said annealing is carried out in an atmosphere created by heating said foils in a closed vessel.

6. A method according to claim 4 wherein said annealing is carried out under reduced pressure.

7. A method according to claim 1 wherein said pressing is carried out at a temperature above room temperature.

8. A method according to claim 6 wherein said pressing is carried out a temperature in the range from 50° to 150° C.

9. A method according to claim said foils are heated up to sintering temperature in steps.

10. A method according to claim 1 wherein the thickness of individual foils is in the range of 30 to 50 microns.

11. A method according to claim 1 wherein said photosensitive material is photoresist.

12. A method according to claim 1 wherein said photosensitive material is a dry film photoresist.

13. A method according to claim 1 wherein said pattern of exposed photo-sensitive material is of cylindrical shape.

14. A method according to claim 1 wherein said pre-defined pattern includes a lesser number of internal cavities closer to the surface of the ceramic body than at the center thereof.

* * * * *